United States Patent
Savanth et al.

(10) Patent No.: US 9,496,785 B2
(45) Date of Patent: Nov. 15, 2016

(54) CONTROLLING VOLTAGE GENERATION AND VOLTAGE COMPARISON

(71) Applicant: ARM Limited, Cambridge (GB)

(72) Inventors: Parameshwarappa Anand Kumar Savanth, Cambridge (GB); James Edward Myers, Cambridge (GB); David Walter Flynn, Cambridge (GB); Bal S. Sandhu, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/922,783

(22) Filed: Oct. 26, 2015

(65) Prior Publication Data

US 2016/0118882 A1    Apr. 28, 2016

Related U.S. Application Data

(63) Continuation of application No. 13/895,624, filed on May 16, 2013, now Pat. No. 9,170,282.

(51) Int. Cl.
| | |
|---|---|
| *G01R 35/06* | (2006.01) |
| *H02M 3/157* | (2006.01) |
| *G01R 19/00* | (2006.01) |
| *H02M 3/07* | (2006.01) |

(52) U.S. Cl.
CPC .......... *H02M 3/157* (2013.01); *G01R 19/0084* (2013.01); *H02M 3/07* (2013.01); *Y02B 70/16* (2013.01)

(58) Field of Classification Search
CPC ............... H03D 3/008; G01R 19/0084; H02M 1/15; H02M 2003/1566; H02M 3/1563

USPC ...................................................... 327/50–97
See application file for complete search history.

(56) References Cited

U.S. PATENT DOCUMENTS

| | | | |
|---|---|---|---|
| 6,806,756 B1 * | 10/2004 | Manlove | H03F 3/45973 327/307 |
| 7,511,645 B1 * | 3/2009 | Ranucci | H03M 1/1019 341/118 |
| 7,907,006 B2 * | 3/2011 | Iwata | H04L 27/06 329/353 |

* cited by examiner

*Primary Examiner* — Lincoln Donovan
*Assistant Examiner* — Diana J Cheng
(74) *Attorney, Agent, or Firm* — Pramudji Law Group PLLC; Ari Pramudji (57) ABSTRACT

An integrated circuit has voltage generating circuitry for generating an on-chip voltage from a supply voltage in response to clock pulses. Clock control circuitry controls transmission of the clock pulses to the voltage generating circuitry. The clock control circuitry receives a reference voltage and a digital offset value comprising a binary numeric value identifying an offset. The clock control circuitry suppresses transmission of the clock pulses if the on-chip voltage is greater than the sum of the reference voltage and the offset identified by the digital offset value, to reduce power consumption. The offset can be tuned digitally to vary the average level of the on-chip voltage. A similar digital tuning mechanism may be used in a clocked comparator to compare a first voltage with a digitally tunable threshold voltage.

13 Claims, 10 Drawing Sheets

FIG. 14

CONTROLLING VOLTAGE GENERATION AND VOLTAGE COMPARISON

CROSS-REFERENCE TO RELATED APPLICATIONS

This application is a continuation of U.S. patent application Ser. No. 13/895,624, filed May 16, 2013, which is titled CONTROLLING VOLTAGE GENERATION AND VOLTAGE COMPARISON and the entire disclosure of which is herein incorporated by reference.

BACKGROUND OF THE INVENTION

The present invention relates to the field of integrated circuits. More particularly, the invention relates to controlling the generation or comparison of voltages in an integrated circuit.

An integrated circuit may be provided with voltage generating circuitry for receiving a supply voltage and generating from the supply voltage an on-chip voltage for use by circuitry within the integrated circuit. The on-chip voltage may be greater or less than the supply voltage. For example, the voltage generating circuitry may include a charge pump which uses capacitors to boost the supply voltage to provide a higher voltage to circuitry within the integrated circuit. However, the voltage generating circuitry consumes a given amount of power and it is desirable to reduce the power consumed by the voltage generating circuitry if possible. Also, sometimes different levels of the on-chip voltage may be required and so it is useful to be able to tune the voltage generation accordingly. The present technique seeks to provide a power-efficient technique for tuning the level of the on-chip voltage generated by the voltage generating circuitry.

SUMMARY OF THE INVENTION

Viewed from one aspect, the present invention provides an integrated circuit comprising:
voltage generating circuitry configured to receive a supply voltage and to generate an on-chip voltage from the supply voltage in response to clock pulses of a voltage generation clock signal;
a circuit block configured to receive the on-chip voltage from the voltage generating circuitry; and
clock control circuitry configured to control transmission of the clock pulses of the voltage generation clock signal to the voltage generating circuitry;
wherein the clock control circuitry is configured to receive a reference voltage and a digital offset value comprising a binary numeric value identifying an offset; and
the clock control circuitry is configured to suppress transmission of the clock pulses of the voltage generation clock signal to the voltage generating circuitry if the on-chip voltage is greater than the sum of the reference voltage and the offset identified by the digital offset value.

Voltage generating circuitry generates an on-chip voltage from a supply voltage in response to clock pulses of a voltage generation clock signal. The on-chip voltage is supplied to a circuit block within the integrated circuit. Clock control circuitry is provided to control transmission of the clock pulses of the voltage generation clock signal to the voltage generating circuitry. By reducing the frequency with which clock pulses are transmitted to the voltage generating circuitry, the clock control circuitry can reduce the power consumed by the voltage generating circuitry, but less frequent pulses may cause the level of the on-chip voltage to drop. The circuit block may require a given voltage level to operate correctly, and so the clock control circuitry may compare the on-chip voltage with a reference voltage to determine whether a clock pulse should be transmitted to the voltage generation circuitry. The clock control circuitry may suppress transmission of clock pulses of the voltage generation clock signal if the on-chip voltage rises beyond the desired value, in order to save power. If the voltage drops too low, then a clock pulse can be sent to the voltage generation circuitry to trigger further generation of the on-chip voltage. In this way, the average level of the on-chip voltage can be controlled to a desired target level.

In typical voltage comparisons, a variable reference voltage would be generated by an analogue voltage generator so that the reference voltage can be set to different levels depending on the target on-chip voltage desired for the circuit block. However, analogue reference voltage generators and comparators consume static power, and the generation of an analogue reference voltage is difficult to implement in a fully digital system-on-chip.

To address this problem, the present technique provides the clock control circuitry with the ability to digitally tune the comparison of the on-chip voltage with a reference voltage. A digital offset value is provided to the clock control circuitry which identifies, from a binary numeric value, an offset for the reference voltage. The clock control circuitry suppresses transmission of clock pulses to the voltage generating circuitry if the on-chip voltage is greater than the sum of the reference voltage and an offset identified by the digital offset value. By supplying different digital offset values, different offsets of the reference voltage can be selected so as to vary the level of the on-chip voltage at which transmission of clock pulses is suppressed or permitted. By providing a digitally tunable offset, any existing voltage within the integrated circuit can be used as the reference voltage, and there is no need for an analogue voltage generator for generating a variable reference voltage. Eliminating the need for an analogue reference voltage generator reduces the power consumed by the integrated circuit and significantly eases implementation.

Another advantage of the present technique is that the clock control circuitry can adapt to different load conditions of the circuit block in a power efficient way. Sometimes the circuit block may have a greater load than at other times (depending on the extent to which the circuit block is active). At times when the circuit load is low, it can be a waste of energy to continue sending many clock pulses to the voltage generating circuitry. In a previous proposal, this problem was addressed by providing a ring oscillator to artificially load the voltage generating circuitry, but this is not power efficient as the oscillator may consume a significant amount of power. In the present technique, the voltage comparison used to control the density of clock pulses supplied to the voltage generating circuitry can detect changes in the on-chip voltage caused by varying circuit loads and adjust the rate at which clock pulses are transmitted accordingly to save power.

The on-chip voltage may be different to the supply voltage (either greater or less than the supply voltage). Also, the voltage generating circuitry may have a bypass mode in which the on-chip voltage is the same as the supply voltage.

The reference voltage may be any voltage within the integrated circuit. However, to reduce circuit area and power consumption, the supply voltage may be used as the reference voltage. As the supply voltage is already being supplied to the voltage generating circuitry for generating the on-chip voltage, supplying the supply voltage to the clock control circuitry as the reference voltage requires little additional circuit overhead.

The clock control circuitry need not actually add an offset voltage to the reference voltage before comparing the total voltage with the on-chip voltage. The clock control circuitry may instead have a circuit configuration which can be adjusted in response to the digital offset value such that the switching point between suppression and transmission of clock pulses occurs at different levels of the on-chip voltage. For example, the clock control circuitry may have a number of built-in offset paths, and different combinations of offset paths may be selected depending on the digital offset value. For different combinations of offset paths, the on-chip voltage may need to rise above different threshold levels before it suppresses clock pulses to the voltage generating circuitry. For any given configuration of offset paths, the "voltage offset" will correspond to the difference between the reference voltage and the on-chip voltage at the switching point when the clock control circuitry switches between suppression of clock pulses and transmission of clock pulses. Hence, the "voltage offset" can be an implied difference between the on-chip voltage and the reference voltage at the switching point, rather than any real voltage arising within the clock control circuitry.

The clock control circuitry may comprise a clocked comparator which receives an input clock signal and, in response to a clock pulse of the input clock signal, transmits a corresponding clock pulse of the voltage generating clock signal to the voltage generating circuitry if the on-chip voltage is less than the sum of the reference voltage and the offset.

The clock control circuitry may be implemented in different ways. The clock control circuitry may have an output node which outputs the voltage generation clock signal to the voltage generating circuitry, and first and second circuitry which compete against each other to pull the output node towards different states. The first circuitry may have a drive current which is dependent on the on-chip voltage and may act to pull the output node towards the first state in which transmission of a clock pulse to the voltage generating circuitry is suppressed. The second circuitry may have a drive current which is dependent on the reference voltage and the digital offset value and may compete with the first circuitry to pull the output node in the other direction towards a second state which triggers transmission of a clock pulse to the voltage generating circuitry. The relative magnitudes of the on-chip voltage and the sum of the reference voltage and the offset will determine which of the first and second circuitry has the larger drive current. The one of the first and second circuitry having the larger drive current will "win" the competition and this determines whether a clock pulse or the voltage generation clock signal is transmitted or suppressed.

The clock control circuitry may have tuning circuitry for adjusting the drive current of the second circuitry in response to the digital offset value. By allowing more or less current to flow through the second circuitry, the offset between the on-chip voltage and the reference voltage at the switching point of the clock control circuitry can be digitally tuned so as to enable different average levels of the on-chip voltage to be selected in a power-efficient way. The tuning circuitry may adjust the drive current of the second circuitry such that the first circuitry overcomes the competition of the second circuitry if the first voltage is greater than a sum of the reference voltage and the offset identified by the digital offset value.

In one example implementation, the second circuitry may have several pulling transistors which are arranged to pull the output node towards the second state. The drive current through the pulling transistors may be dependent upon the reference voltage (for example, the reference voltage, or another voltage which depends on the reference voltage, may be applied to the gate terminals of the pulling transistors). The tuning circuitry may select which of the pulling transistors are active based on the digital offset value. By selecting different combinations of pulling transistors, different drive currents through the second circuitry can be obtained, thus requiring a different drive current in the first circuitry to overcome the competition of the second circuitry, and hence a different level of the on-chip voltage.

To control whether the pulling transistors are active or not, the tuning circuitry may have one or more switching transistors. Each switching transistor may select whether a corresponding pulling transistor of the second circuitry is active depending on a corresponding bit of the digital offset value. Each bit of the digital offset value may switch on or off a corresponding switching transistor in order to activate or deactivate a corresponding pulling transistor. The more pulling transistors that are active, the greater the drive current provided by the second circuitry for a given level of reference voltage, and hence the greater the level of the on-chip voltage at the switching point between suppression and transmission of clock pulses. It is not essential for every pulling transistor to have a corresponding switching transistor. At least one pulling transistor may be permanently active to provide a default level for the drive current of the second circuitry when none of the pulling transistors which have corresponding switching transistors are active.

At least some of the pulling transistors in the second circuitry may pass different drive currents in response to the same level of reference voltage. For example, the transistors may have different sizes, different semiconductor doping conditions, or some other difference in configuration which causes them to pass different drive currents in response to the same level of reference voltage. While it would be possible to provide a number of identically configured pulling transistors, providing differently configured pulling transistors increases the granularity with which the offset can be changed since different combinations of active pulling transistors will pass different total drive currents. For example, if the different drive currents are in ratios of powers of two then the total drive current can be approximately proportional to the binary value of the digital offset value. For example, if the switching transistors corresponding to pulling transistors with drive currents in ratios 16, 8, 4, 2, 1 are controlled in response to bits [4:0] of the digital offset value respectively, then 5 transistors can provide 32 relatively evenly distributed levels of drive currents and hence 32 different offsets to the reference voltage. In contrast, if all the pulling transistors provide the same drive current then 5 transistors could only provide 5 different levels of offset (corresponding to 1, 2, 3, 4 and 5 transistors being active), since different permutations of active/non-active transistors would correspond to the same total drive current.

Although ideally the offset would scale linearly with the digital offset value input to the clock control circuitry, in practice this may not be achieved in an actual circuit implementation. For example, temperature variations or process variations occurring during the manufacture of the integrated circuit may cause the actual offset to vary non-linearly between different values of the digital offset value. To address this problem, an offset converter may be provided for converting an input offset value input to the integrated circuit into a corresponding digital offset value to be supplied to the clock control circuitry. For example, the offset converter may have a read only memory (ROM) which stores digital offset values corresponding to different values of the input offset value. When an offset value is input by the user, the ROM can look up the corresponding value to be supplied to the clock control circuitry. The ROM can be loaded with non-linearly varying digital offset values at test-time and during run-time the ROM can then be addressed with linearly varying input addresses provided by the user.

A multiplexer may be provided to provide a choice of clock signals for input to the voltage generating circuitry. The multiplexer may for example choose between the voltage generation clock signal controlled by the clock control circuitry and a further voltage generating clock signal, which may be generated by an off-chip or on-chip clock generator. A choice of clocks is useful for several reasons. When the voltage generating circuitry first starts to generate the on-chip voltage, it can be useful to provide a further clock signal which does not have its clock pulses suppressed by the clock control circuitry, so that the on-chip voltage may reach a given level before the clock control circuitry is activated to save power (otherwise, it may take a longer time before the voltage generating circuitry settles into its normal operation). Also, if the maximum available level of the on-chip voltage is desired, then it can be more efficient to run the voltage generating circuitry with a constant clock signal rather than suppressing some clock signals using the clock control circuitry. The multiplexer may also be used to select between an on-chip generated clock and a clock generated off-chip. For example, while an off-chip clock may be used for regular operation of the integrated circuit, in a deep power saving state it may be desired to operate without any external clock source and so in this case an on-chip clock may be selected. Also, if the on-chip voltage different from the supply voltage is only required in certain modes of operation of the circuit block, then for other modes the multiplexer could supply a non-varying signal as the voltage generation clock signal to save power by avoiding clocking the voltage generating circuitry.

The on-chip voltage may be greater or less than the supply voltage, depending on the voltage required by the circuit block. In some cases the on-chip voltage may be less than the supply voltage. However, the present technique is particularly useful if the on-chip voltage is greater than the supply voltage, for example where the voltage generating circuitry comprises charge pump circuitry which boosts the supply voltage to generate the on-chip voltage. A charge pump uses capacitors to boost a supply voltage to generate a higher voltage. By charging the capacitor in one part of the clock cycle and discharging the capacitor in another part of the clock cycle, the supply voltage can be increased by accumulating charge from the capacitor. If the pulse density of the clock signal is high, then the on-chip voltage will be higher, but more power will be consumed because the circuitry within the charge pump will incur more dynamic power. On the other hand, if the pulse density of the clock signal is low, then power consumption is reduced due to the reduced number of charge/discharge cycles, but the generated voltage will tend to drop during the periods between successive clock pulses. The present technique allows the operation of the charge pump to be tuned digitally to balance power savings against the level of the on-chip voltage generated using the charge pump, depending on the current requirements of the circuit block.

Viewed from another aspect the present invention provides an integrated circuit comprising:
  voltage generating means for receiving a supply voltage and generating an on-chip voltage from the supply voltage in response to clock pulses of a voltage generation clock signal;
  circuit block means for receiving the on-chip voltage from the voltage generating circuitry; and
  clock control means for controlling transmission of the clock pulses of the voltage generation clock signal to the voltage generating means;
  wherein the clock control means is configured to receive a reference voltage and a digital offset value comprising a binary numeric value identifying an offset; and
  the clock control means is configured to suppress transmission of the clock pulses of the voltage generation clock signal to the voltage generating means if the on-chip voltage is greater than the sum of the reference voltage and the offset identified by the digital offset value.

Viewed from a further aspect the present invention provides a method of generating an on-chip voltage in an integrated circuit comprising voltage generating circuitry, the method comprising:
  generating the on-chip voltage using the voltage generating circuitry, wherein the on-chip voltage is generated from a supply voltage in response to clock pulses of a voltage generation clock signal; and
  controlling transmission of the clock pulses of the voltage generation clock signal to the voltage generating circuitry;
  wherein the controlling comprises suppressing transmission of the clock pulses of the voltage generation clock signal to the voltage generating circuitry if the on-chip voltage is greater than the sum of a reference voltage and an offset identified by a digital offset value received by the integrated circuit, the digital offset value comprising a binary numeric value identifying the offset.

Viewed from another aspect the present invention provides a clocked comparator comprising:
  a first voltage input configured to receive a first voltage;
  a reference voltage input configured to receive a reference voltage;
  a clock input configured to receive an input clock signal;
  an offset input configured to receive a digital offset value comprising a binary numeric value identifying an offset;
  comparing circuitry configured to generate an output signal indicating whether, at a clock transition of the input clock signal, the first voltage is greater or less than a sum of the reference voltage and the offset identified by the digital offset value; and
  tuning circuitry configured to adjust the comparing circuitry to vary the offset in response to the digital offset value.

The technique described above where a digitally adjusted offset tunes a clocked comparison between a voltage and a reference voltage can also be used for applications other than controlling voltage generation. The clocked comparator may have comparing circuitry which compares a first voltage against a reference voltage with offset, and tuning circuitry for adjusting the comparing circuitry to vary the offset in response to the digital offset value. This enables the clocked comparator to tune the level against which the first voltage is compared without requiring an analogue component such as a reference voltage generator or digital-to-analogue converter, which would increase power consumption and circuit complexity.

The comparing circuitry of the clocked comparator may be similar to the clock control circuitry described above. The comparing circuitry may have first circuitry and second circuitry which compete to pull an output node towards different states. The drive current of the first circuitry is dependent on the first voltage, and the drive current of the second circuitry is dependent on the reference voltage and the digital offset value. Depending on which of the drive currents is greater, the output node will be pulled towards one of the first and second states to indicate whether the first voltage is greater than the sum of the reference voltage and the offset. The tuning circuitry may adjust the drive current of the second circuitry based on the digital offset value in a similar way to discussed above, by selecting whether different pulling transistors are active using switching transistors.

The clocked comparator may be used for different purposes in an integrated circuit. The clocked comparator may be used in any situation where it is required to digitally tune a comparison between two voltages at a timing controlled by an input clock signal. In one example, the clocked comparator may be used to control whether clock pulses are transmitted to voltage generating circuitry for generating an on-chip voltage, as discussed above.

Also, the clocked comparator may be used in a voltage measuring device to measure the magnitude of the first voltage. The output signal of the clocked comparator indicates whether the first voltage is greater or less than the sum of the reference voltage and the offset value, and so this provides a qualitative indication of the level of the first voltage.

To provide a quantitative indication of the first voltage level, a counter may be provided to count transitions of the output signal of the clocked comparator. The counter may count the number of transitions occurring within a given time period, and the voltage measuring device may adjust the digital offset value in steps until the counter detects zero transitions of the output signal in a given period of time, at which point the value of the offset will represent the difference between the first voltage and the reference voltage, allowing the magnitude of the first voltage to be measured.

For the clocked comparator, the reference voltage may comprise any voltage. For example, when the clocked comparator is included in an integrated circuit, a supply voltage or any other voltage present in the integrated circuit may be used as the reference voltage.

If there is no suitable reference voltage available on the integrated circuit, then a previous value of the first voltage may be used as the reference. For example, a holding element such as a latch or a capacitor may be provided to hold the first voltage from an earlier clock cycle for comparison against the first voltage in a later cycle. This scheme can be used to generate an output which reflects the difference between instantaneous voltage examples in a similar way to a delta-sigma comparator.

Viewed from another aspect, the present invention provides a clocked comparator comprising:

voltage input means for receiving a first voltage and a reference voltage;

clock input means for receiving an input clock signal;

offset input means for receiving a digital offset value identifying an offset as a binary numeric value;

comparing means for generating an output signal indicating whether, at a clock transition of the input clock signal, the first voltage is greater or less than a sum of the reference voltage and the offset identified by the digital offset value; and tuning means for adjusting the comparing circuitry to vary the offset in response to the digital offset value.

BRIEF DESCRIPTION OF THE DRAWINGS

The present technique will be described further, by way of example only, with reference to embodiments thereof as illustrated in the accompanying drawings in which.

DESCRIPTION OF EXAMPLE EMBODIMENTS

Figure 1:
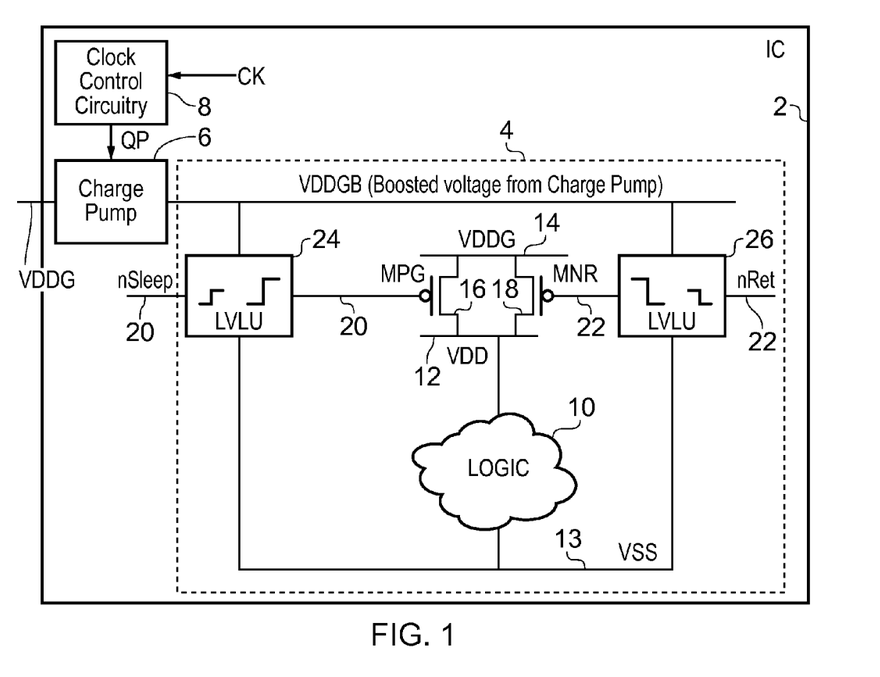
FIG. 1 illustrates an integrated circuit having voltage generating circuitry.

FIG. 1 schematically illustrates an integrated circuit 2 comprising a circuit block 4, voltage generating circuitry 6, and clock control circuitry 8. In this example, the voltage generating circuitry 6 comprises a charge pump, although other forms of voltage generating circuitry could also be used. The integrated circuit 2 is supplied with a supply voltage VDDG. The charge pump 6 converts the supply voltage to a boosted on-chip voltage VDDGB which is supplied to the circuit block 4. The clock control circuitry 8 receives an input clock signal CK and controls transmission of a voltage generation clock signal QP to the charge pump 6. The clock control circuitry 8 selectively prevents or allows clock pulses of the input clock signal CK to be transmitted to the charge pump 6 as clock pulses of the voltage generation clock signal QP.

The circuit block 4 comprises processing logic 10 which is coupled between a virtual supply power rail 12 (VDD) and a ground power rail 13 (VSS). The virtual supply power rail 12 is coupled to a supply rail 14 (VDDG) carrying the supply voltage VDDG via a power gating transistor 16 and a retention transistor 18, which are arranged in parallel with one another. The power gating transistor 16 is a PMOS transistor which receives at its gate a sleep signal 20 which controls whether the logic 10 is placed in an active mode or a power saving mode. When the sleep signal 20 is low, then the power gating transistor 16 is on and so the virtual supply rail 12 is brought to the supply voltage level VDDG to place the processing logic 10 in the active mode. When the sleep signal 20 is high then the power gating transistor 16 becomes less conductive and isolates the virtual supply power rail 12 from the supply voltage VDDG on the supply power rail 14, to place the logic 10 in a power saving mode in which power consumption is reduced and the logic 10 is inactive. During the power saving mode, the internal state of the processing logic 10 (e.g. register contents) is lost. The retention transistor 18 is an NMOS transistor which receives at its gate a retention signal 22 which controls the retention transistor 18 to selectively place the processing logic 10 in the retention mode in which power consumption is reduced but the state within the processing logic 10 is retained. In the retention mode, power consumption is lower than in the normal mode but higher than in the power saving mode. While FIG. 1 shows one power gating transistor 16 and one retention transistor 18, it will be appreciated that in practice multiple power gating transistors 16 and retention transistors 18 may be provided.

Without the charge pump 6, sleep and retention signals 20, 22 would normally vary between the ground level VSS and the supply level VDDG. However, the boosted voltage VDDGB is used by level shifters 24, 26 to convert the sleep and retention signals 20, 22 into signals varying between the ground level VSS and the boosted voltage level VDDGB. Driving the power gating transistor 16 and retention transistor 18 with a boosted voltage is useful for power saving and reliability reasons. For the power gating transistor 16, overdriving the gate of the transistor with a boosted sleep signal turns the power gating transistor 16 off more strongly, reducing leakage through the power gating transistor during the power saving mode, and therefore reducing power consumption of the integrated circuit 2. For the retention transistor 18, during the retention mode the potential difference across the processing logic 10 is reduced. To retain state in the processing logic 10, a minimum potential difference may be required. Applying a boosted voltage to the retention transistor 18 can increase the potential difference across the processing logic 10 slightly to ensure that the potential difference is sufficient to retain state. While FIG. 1 shows an example in which it may be useful to use a boosted voltage which is higher than the supply voltage VDDG supplied to the integrated circuit 2, there may also be other reasons for using a boosted voltage, and the present technique is not limited to the example of the circuit block 4 shown in FIG. 1.

Figure 2:
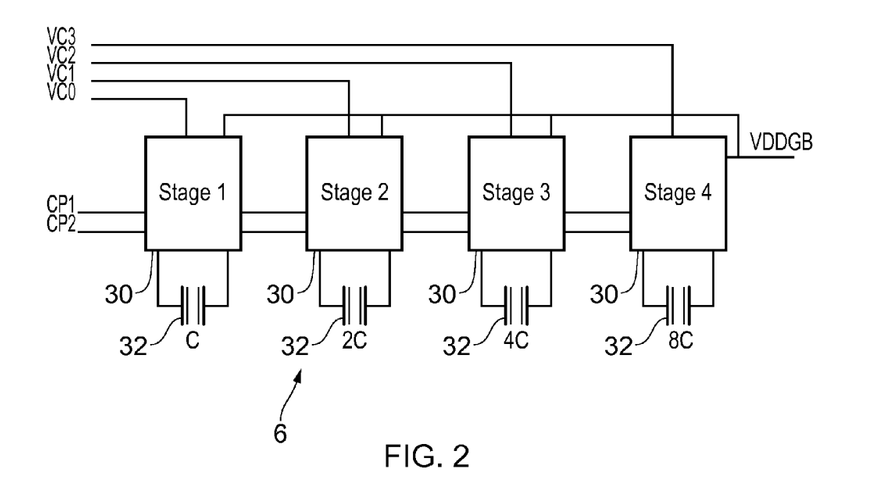
FIG. 2 illustrates a charge pump having multiple stages which can be used as an example of the voltage generating circuitry.

FIG. 2 shows an example of the charge pump 6 for generating the boosted voltage VDDGB. Charge pump 6 has several charge pumping stages 30 which are clocked using complementary clock signals CP1, CP2 (corresponding to the clock shown as a single clock QP in FIG. 1 for conciseness—the second complementary clock can be generated by inverting clock QP). Each stage 30 also receives a control signal VC0-VC3 for selecting whether the stage 30 is active. Each stage has a capacitor 32 which is charged during one half of a clock cycle and which is discharged during the other half of the clock cycle. By charging and discharging the capacitor 32, the voltage can be boosted. To provide different amounts of voltage boost, different numbers of stages can be activated at a time using the control signals VC0-VC3. While the capacitances of the capacitors 32 of each stage could be the same, in the example of FIG. 2 the capacitances vary in powers of two (C, 2C, 4C, 8C) so that a total capacitance corresponding to the binary value of control signal VC3:VC2:VC1:VC0 can be selected.

Figure 3:
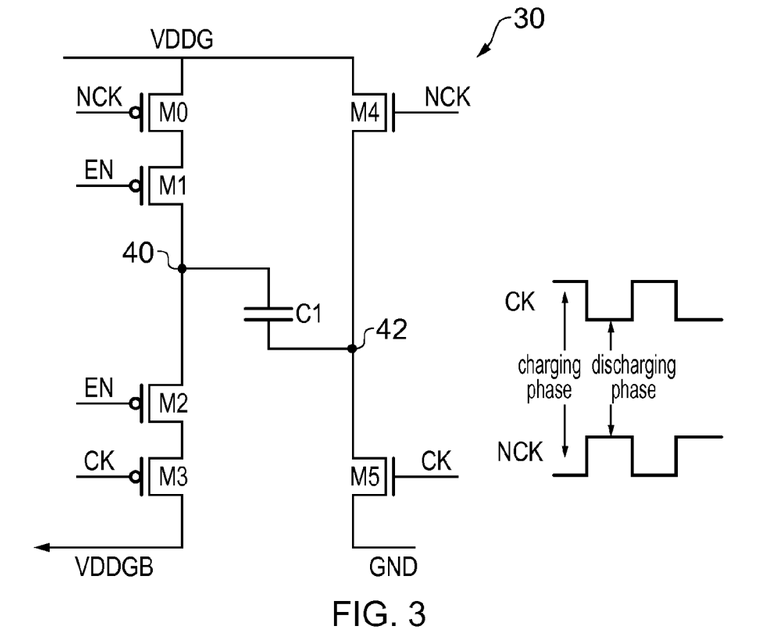
FIG. 3 illustrates an example circuit implementation of a single stage of the charge pump of FIG. 2.

FIG. 3 shows an example of a charge pumping circuit which can be used in any of the charge pumping stages 30 shown in FIG. 2 to convert the supply voltage VDDG to the boosted voltage VDDGB. A capacitor C1 is coupled between a first circuit node 40 and a second circuit node 42. The capacitor C1 is charged during a charging phase of operation and discharged during a discharging phase of operation. In this example, the charging phase occurs when clock signal CK (CP1) is high and its complementary clock signal NCK (CP2) is low and the discharging phase occurs when the clock signal CK is low and the complementary clock signal NCK is high (although this could be implemented the other way round if desired).

During the charging phase, PMOS transistors M0, M1 couple the first circuit node 40 to the supply voltage VDDG and NMOS transistor M5 couples the second circuit node 42 to the ground voltage GND (corresponding to VSS in FIG. 1). This causes the capacitor C1 to be charged with a voltage difference across the capacitor C1 corresponding to (VDDG−GND). During the discharging phase, transistors M0 and M5 are switched off and transistors M3 and M4 are switched on. This couples the second circuit node 42 to the supply voltage VDDG and couples the first circuit node 40 to the output node which is to carry the boosted voltage VDDGB. Connecting the second circuit node 42 to the supply voltage VDDG brings the side of the capacitor C1 which was previously at the ground level GND to the supply voltage level VDDG. As there was already a voltage difference (VDDG−GND) across the capacitor C1, the voltage at the other side of the capacitor C1 is then boosted to (2VDDG−GND), which is output as the boosted voltage VDDGB (in practice the boosted voltage will be slightly less than 2VDDG−GND due to losses caused by leakage for example). By repeating the charging and discharging phases in response to each pulse of the clock signal CK/NCK, the boosted voltage VDDGB can be maintained over a period of time to generate a voltage level higher than the supply level VDDG supplied to the integrated circuit 2. If the boosted voltage is not required for a time, then transistors M1, M2 can be selectively turned off using an enable signal EN (corresponding to signal VC shown in FIG. 2) to deactivate the charge pump, in which case the boosted voltage VDDGB will be reduced to the level of the supply voltage VDDG.

Figure 4A:
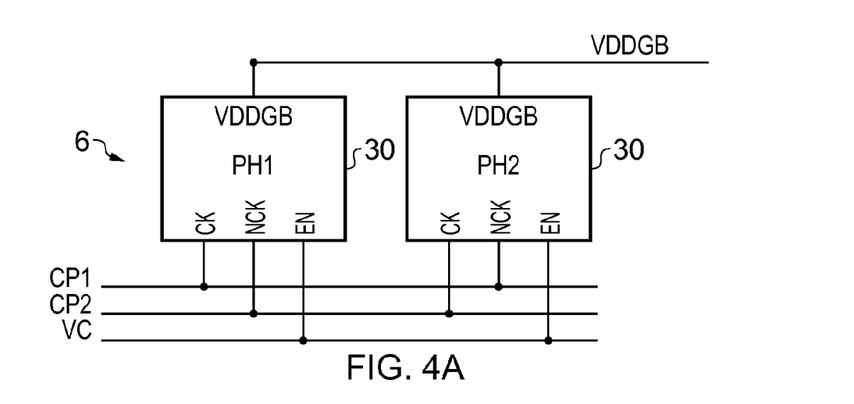
FIGS. 4A and 4B illustrate an example of a charge pump in which successive charging stages are clocked by a complementary phases of a clock signal.
Figure 4B:
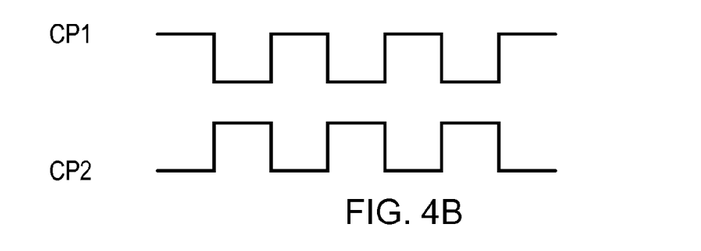

Each stage 30 of the charge pump 6 is similar to FIG. 3 and independently generates a boosted voltage VDDGB. By providing multiple stages, a greater load can be supplied with the boosted voltage VDDGB. As shown in FIGS. 4A and 4B, successive stages of the charge pump 6 may be provided with complementary clock signals CP1, CP2 which are synchronised but have opposite polarity. This is useful for smoothing the boosted voltage VDDGB generated by the charge pump 6. If each stage was clocked with the same polarity of clock signal then the boosted voltage VDDGB would be generated during the discharge phase but would not be generated during the charging phase, resulting in an oscillating signal. By connecting one stage PH1 with its clock input CK connected to the first clock CP1 and its inverted clock input NCK connected to the second clock CP2, and connecting a second stage PH2 the other way round with its clock input CK connected to the second clock CP2 and its inverted clock input NCK connected to the first clock CP1, the charging phase of one stage can be occurring at the same time as the discharging phase of another stage, to reduce the variation in the boosted voltage VDDGB. Another example of a charge pump 6 which can be used is disclosed in the commonly assigned U.S. patent application Ser. No. 13/562,516, the contents of which are hereby incorporated by reference.

In this way, the charge pump 6 generates a boosted voltage for use in the integrated circuit 2. However, the transistors shown in FIG. 3 suffer from dynamic power loss each time the clock changes state. The greater the frequency of the clock signal provided so the charge pump 6, the greater the power loss, and the greater the total power consumed. The clock control circuitry 8 controls the transmission of the clock pulses to the charge pump 6 so that if a sufficient voltage level is being generated then the transmission of clock pulses can be suppressed for a time to save power, before transmitting another clock pulse once the boosted voltage VDDGB has dropped below a threshold level. This balances the need for low power consumption against the need for a boosted voltage of a given level to be generated. The clock control circuitry 8 also allows the voltage generation to adapt to different levels of circuit load of the circuit block 4, as will be explained below with respect to FIG. 11.

Figure 5:
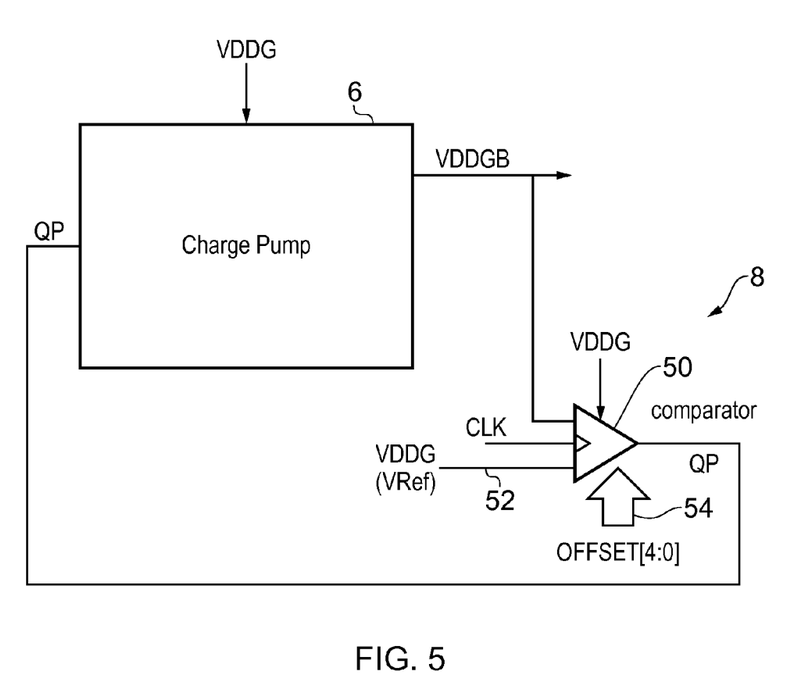
FIG. 5 illustrates an example of clock control circuitry for controlling whether clock pulses are transmitted to the voltage generating circuitry.

FIG. 5 shows an example of the clock control circuitry 8 for controlling the transmission of clock pulses to the charge pump 6. The clock control circuitry 8 comprises a clocked comparator 50 which compares the boosted voltage VDDGB from the charge pump 6 with a reference voltage 52. In this example, the supply voltage of VDDG is used as the reference voltage 52, although another voltage within the integrated circuit 2 could also be used as a reference instead if desired. The reference voltage 52 is offset by a digitally tunable offset identified by a digital offset value 54 which is input to the integrated circuit 2 from the outside. If the boosted voltage VDDGB is not greater than the sum of the reference voltage 52 and the offset identified by the offset value 54, then a clock pulse of an input clock CLK is propagated to the charge pump 6 as a clock pulse of the voltage generation clock QP. On the other hand, if the boosted voltage VDDGB is greater than the sum of reference voltage 52 and the offset represented by the digital offset value 54, then a clock pulse is not propagated to the charge pump 6.

The offset value 54 allows the user to tune the level of the boosted voltage VDDGB at which the comparator 50 will switch between generation and suppression of clock pulses. The offset value 54 is a digital value which expresses the offset as a binary numeric value (in this example, a 5-bit value OFFSET [4:0]). The comparator has a number of built-in offset levels hardwired into its circuitry and selects an appropriate offset based on the binary value input by the user. If the offset is large then the boosted voltage VDDGB will not be allowed to drop far before it drops below the sum of the reference voltage 52 and the offset and another clock pulse is transmitted to the charge pump 6 to boost the voltage back up to its maximum boosted value. On the other hand, if the offset is small then the boosted voltage VDDGB can drop closer to the reference voltage 52 before it drops below the sum of the reference voltage and the offset, and so there will be a longer period between successive clock pulses of the clock signal QP. In this way, the pulse density of the voltage generation clock signal QP can be controlled so as to vary the average value of the boosted voltage VDDGB over time, and vary the power consumed.

Figure 6:
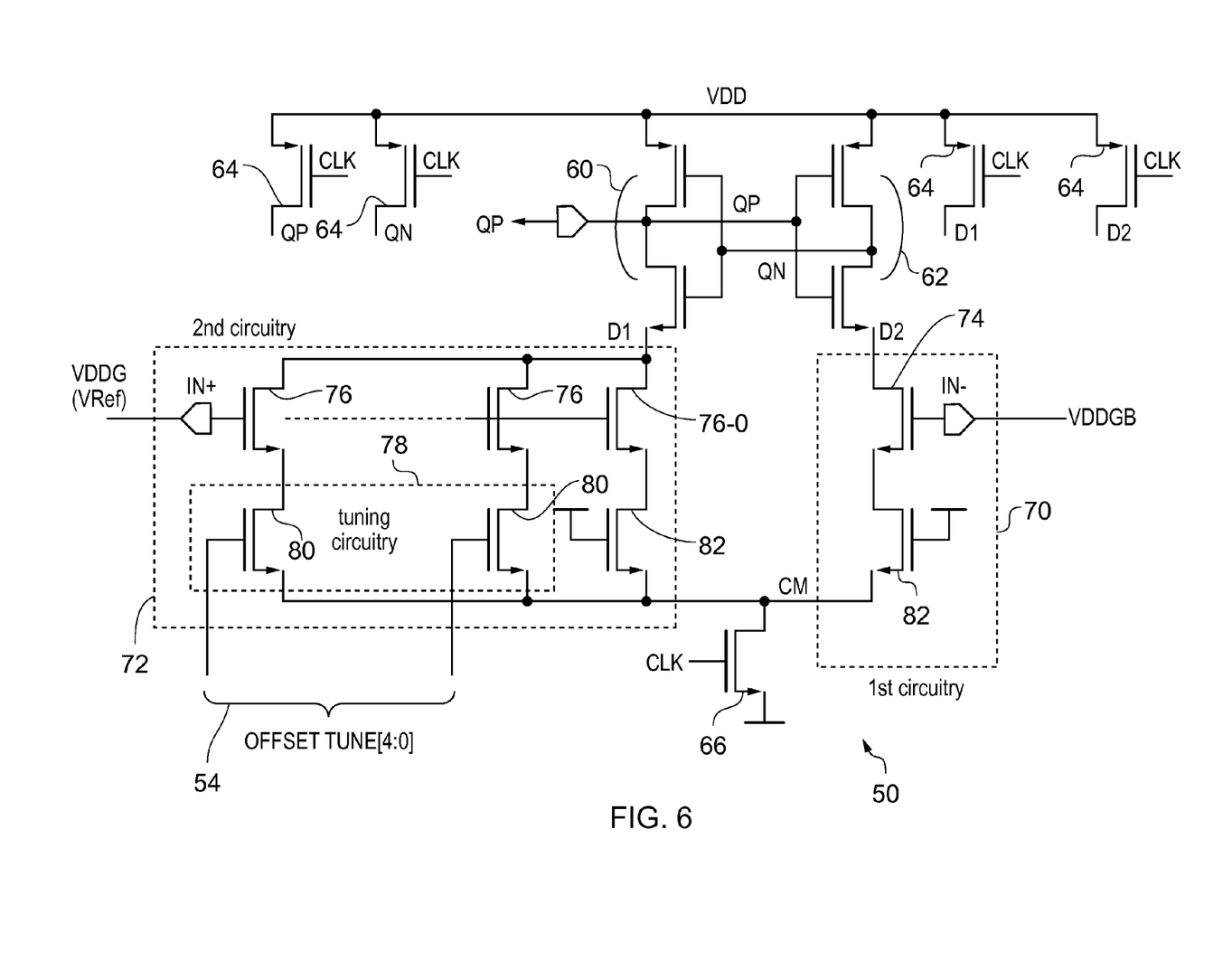
FIG. 6 shows an example circuit arrangement of the clock control circuitry.

FIG. 6 shows a circuit example of the clocked comparator 50 shown in FIG. 5, although it will be appreciated that other circuit implementations could also be used. The clocked comparator 50 comprises a pair of cross couple inverters 60, 62. The output node of one of the inverters 60 is output as the voltage generation clock signal QP for clocking the charge pump 6. Several reset transistors 64 are provided to reset various circuit nodes of the cross coupled inverters 60, 62 to initial values when the input clock signal CLK is low. The reset transistors 64 pull QP high as a default value in this embodiment (other implementations may reset QP low).

A trigger transistor 66 is switched on when the input clock signal CLK transitions high, and this triggers a competition between first circuitry 70 and second circuitry 72 which compete against one another to cause the output node QP to be pulled towards opposite states. The first circuitry comprises a pulling transistor 74 which has its gate coupled to the boosted voltage VDDGB, so that the drive current through the first circuitry 70 depends on the magnitude of the boosted voltage VDDGB. The second circuitry 72 has several pulling transistors 76 whose gates are coupled to the reference voltage VRef (which is the supply voltage VDDG in this example). Therefore, the drive current through the second circuitry 72 depends on the reference voltage VDDG. The second circuitry 72 has tuning circuitry 78 which varies the drive current of the second circuitry 72 in response to the digital offset value 54. The tuning circuitry 78 has a number of switching transistors 80 which are switched on and off in response to respective bits of the digital offset value 54. Each switching transistor 80 controls whether a corresponding one of the pulling transistors 76 of the second circuitry 72 is active. Different pulling transistors 76 may have different drive strengths (e.g. caused by different transistor sizes or different doping concentrations) and so by switching on or off different combinations of the switching transistors 80 in response to the digital offset value 54, different drive strength offsets can be provided to supplement the drive strength provided by a default pulling transistor 76-0 which is always on. By providing different drive strengths of the pulling transistors 76 in proportion to ratios of powers of two (1, 2, 4, 8, 16 . . . ), it is possible to build up a number of relatively evenly spaced offsets configurations proportional to the binary numeric value of the digital offset value 54.

When the trigger transistor 66 switches on in response to a rising edge of the input clock signal CLK, then whichever of the first circuitry 70 and second circuitry 72 has the greater drive current will win the competition to influence the state of the cross coupled inverters 60, 62. If the boosted voltage VDDGB is greater than the sum of the reference voltage VDDGB and the offset represented by the offset value 54, then the pulling transistor 74 of the first circuitry 70 will have a greater drive current than the total drive current of the active pulling transistors 76 in the second circuitry 72, and this will cause the output node QP of the cross coupled inverters to be pulled high, which suppresses the transmission of a clock pulse to the charge pump 6 (QP will remain high as initialised by reset transistors 64). On the other hand, if the boosted voltage VDDGB is less than the sum of the reference voltage VDDGB and the offset, then the drive current through the second circuitry 72 will be greater than the drive current through the first circuitry 70 and so the second circuitry 72 will win the competition and will cause the output node QP to drop low corresponding to a clock pulse being transmitted to the charge pump 6. The greater the drive strength of the active transistors, the greater the offset and so the higher the value of the boosted voltage VDDGB at the point where the comparator 50 switches between triggering and suppressing a clock pulse.

This form of clocked comparison enables a digital tuning of the threshold level with which the boosted voltage is compared. The reference voltage VDDG itself can remain fixed and so there is no need for an analogue voltage generator for varying the level of the reference voltage. Instead, a number of different offset paths are hardwired into the comparator 50 in the second circuitry 78 and these can be selected using the digital offset value 54 to vary the threshold level, and hence the average level of the boosted voltage VDDGB.

Although the first circuitry does not have any switching transistors 80 since it is always active, a balancing transistor 82 may be provided in series with the pulling transistor 74 to mirror the effect of the current passing through the switching transistors 80 in the second circuitry 72 when the switching transistors 80 are active. Similarly, a balancing transistor 82 may be provided in the second circuitry for any pulling transistors 76-0 which are permanently active. The balancing transistors 82 ensure that the difference in drive current between the first circuitry 70 and second circuitry 72 is due to the difference between the boosted voltage VDDGB and the sum of the reference voltage VDDG and offset, and not due to other differences in circuit configuration.

Although FIG. 6 shows the pulling transistors 74, 76 having their gates coupled directly to the boosted voltage VDDGB or reference voltage VRef, in other examples they may be controlled indirectly by another voltage which depends on VDDGB or VRef.

Figure 7:
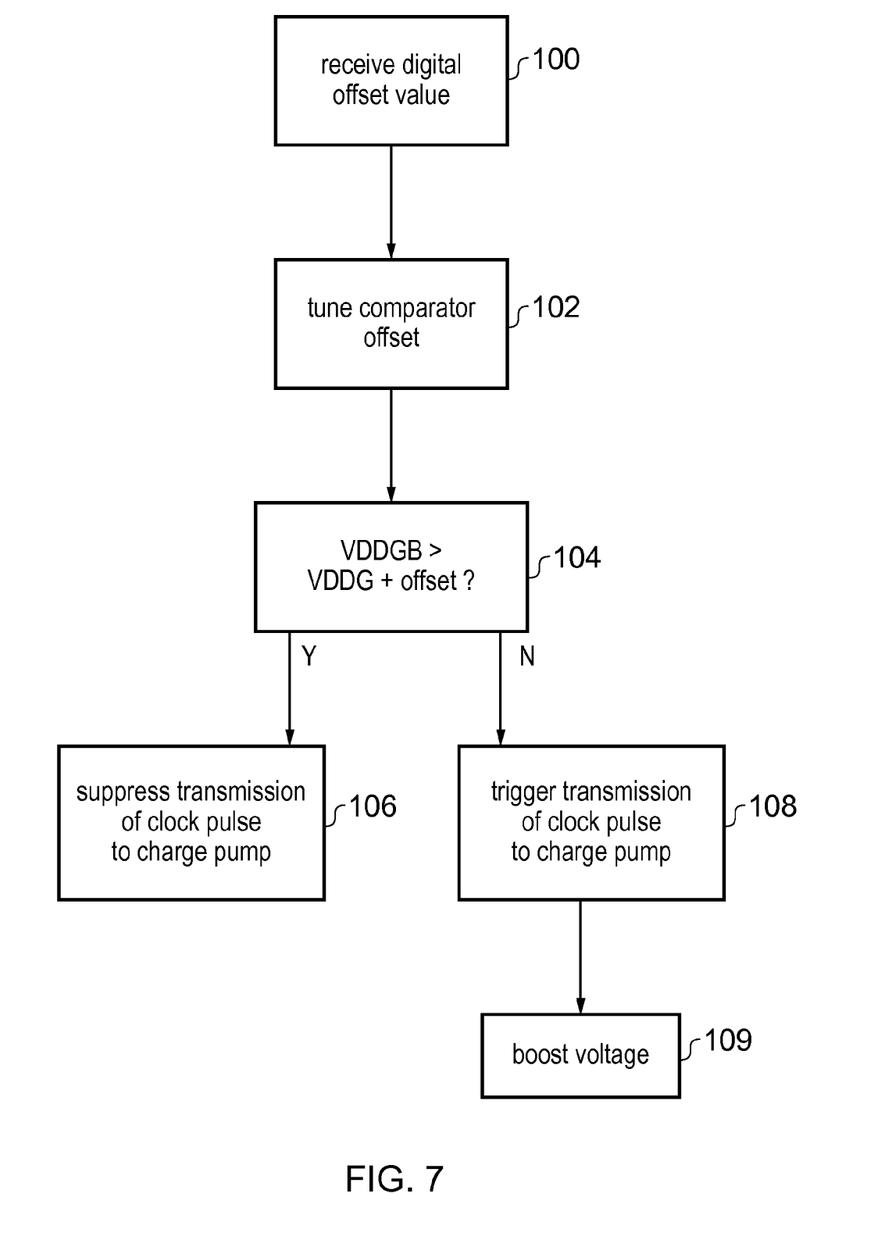
FIG. 7 illustrates a method of controlling voltage generation in the integrated circuit.

FIG. 7 shows a method of controlling voltage generation in an integrated circuit. At step 100, the clock control circuitry 8 receives the digital offset value 54 identifying the offset to be applied to the reference voltage 52. At step 102 the control circuitry 8 tunes the comparator offset by switching on or off different switching transistors 80 according to the corresponding bits of the offset value. At step 104 the boosted voltage VDDGB is compared against the sum of the reference level VDDG and the offset. The offset depends on which of the switching transistors 80 have been turned on to make the corresponding pulling transistors 76 of the second circuitry 70 active. If the boosted voltage VDDGB is greater than the sum of the reference voltage VDDG and the offset, then at step 106 transmission of a clock pulse to the charge pump 6 is suppressed. On the other hand, if the boosted voltage VDDGB is not greater than the sum of the reference voltage VDDG and the offset, then at step 108 a clock pulse is transmitted to the charge pump to trigger a boost to the voltage VDDGB at step 109. In the case where the boosted voltage VDDGB is equal to the sum of the reference voltage VDDG and the offset, either of steps 106 and 108 may be selected.

Figure 8A:
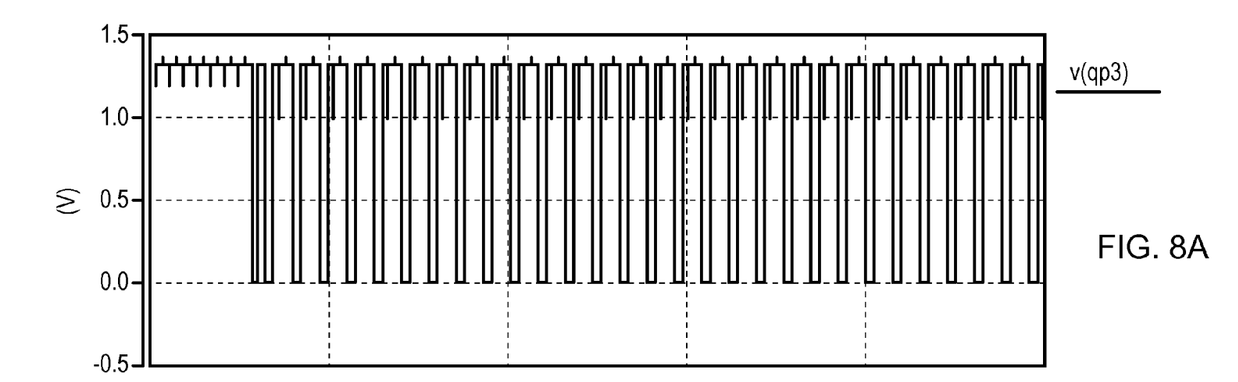
FIGS. 8A and 8B are timing diagrams illustrating the voltage generation clock signal and the generated on-chip voltage in a first example of operation of the integrated circuit.
Figure 8B:
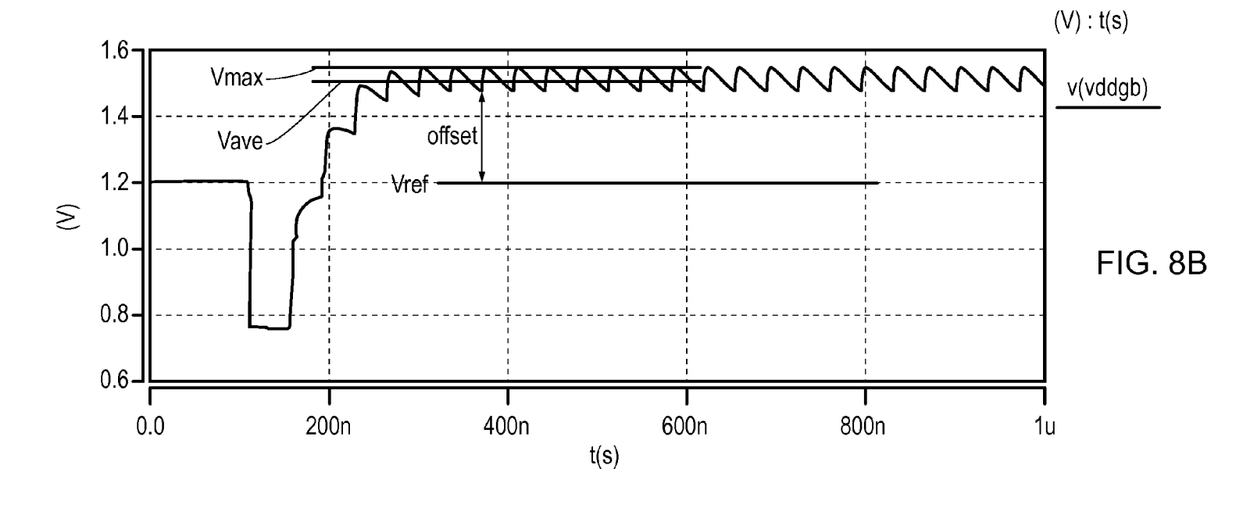

FIGS. 8A to 9B are graphs showing two examples of the charge pump clock signal QP and the boosted voltage VDDGB generated by the charge pump 6 in response to the clock signal QP. In the example shown in FIGS. 8A and 8B, the offset is set to be relatively high. FIG. 8A shows the clock pulses QP sent to the charge pump 6 while FIG. 8B shows the boosted voltage VDDGB generated by the charge pump 6. Each time a clock pulse is sent to the charge pump 6, the boosted voltage VDDGB rises to a maximum value Vmax and then starts to drop until another clock pulse is sent. As the offset is reasonably high then it does not take long for the boosted voltage to drop below the sum of the reference voltage Vref and the offset, at which point another clock pulse is generated to boost the voltage back up to the maximum level. Therefore, in FIG. 8B the average level Vave of the boosted voltage over time is relatively high. This mode of operation may be selected if a relatively high boosted voltage is required by the circuit block 4.

Figure 9A:
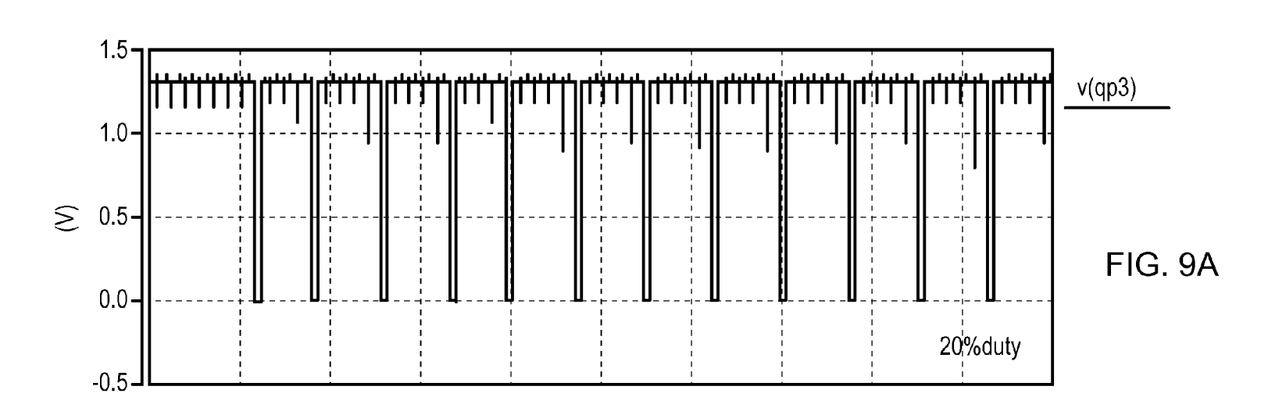
FIGS. 9A and 9B are timing diagrams illustrating the voltage generation clock signal and on-chip voltage in a second example of operation in which the voltage offset is reduced compared to the first example.
Figure 9B:
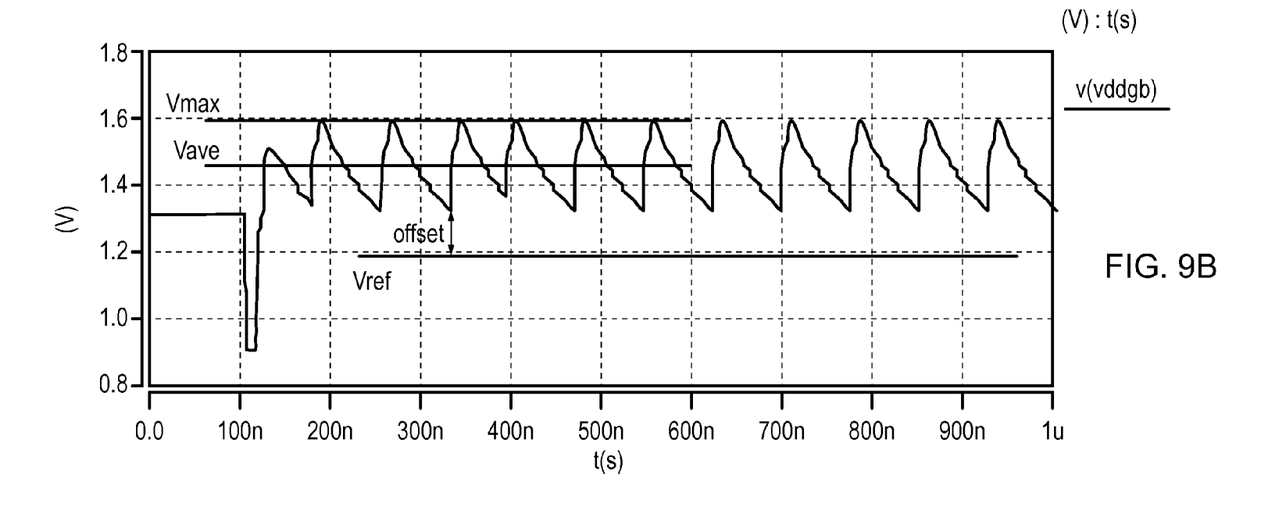

On the other hand, in FIGS. 9A and 9B a lower voltage setting has been selected by providing an offset value corresponding to a small offset. While the maximum boosted voltage level Vmax is still the same as in FIG. 8B, the lower offset means that the voltage can drop further before it drops below the sum of the reference voltage and the offset, and so there is a longer period between successive clock pulses in FIG. 9A than in FIG. 8A. The duty ratio in FIG. 9A is 20% such that 4 out of 5 clock pulses are suppressed. As the number of clock pulses is reduced, the power consumption is lower since there is less dynamic power loss in the charge pump 6. The time averaged value Vave of the boosted voltage VDDGB is lower in FIG. 9B than in FIG. 8B because clock pulses are not being generated as frequently and so the voltage drops further between successive clock pulses.

Hence, by providing different offset values 54, the user or a control circuit can select different operating modes using a digital control mechanism. It is not necessary to provide an analogue voltage generator for generating different levels of the reference value voltage 52. Instead, the supply voltage or any other voltage within the circuit can simply be used as a constant reference and the offset can be tuned digitally using the comparator 50.

Figure 10:
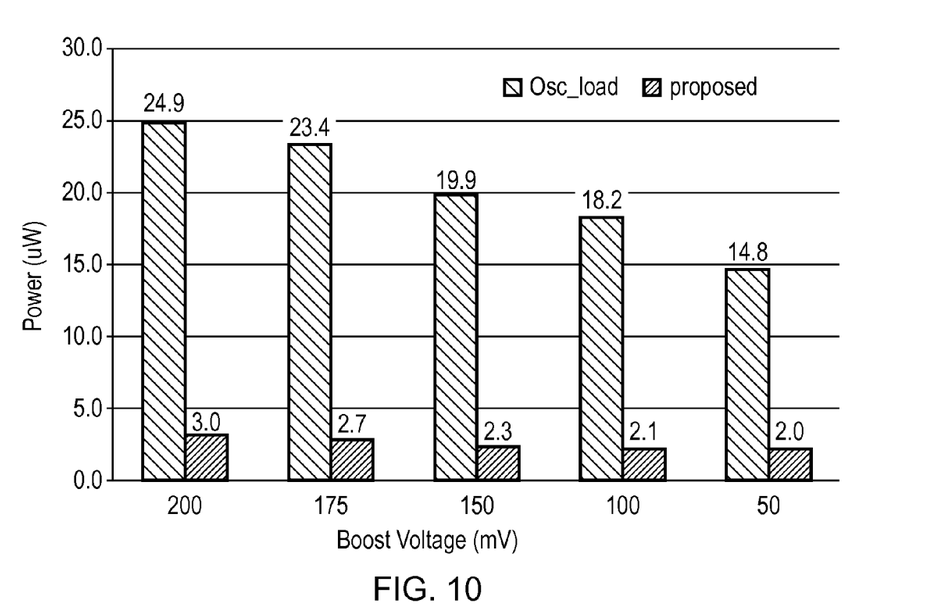
FIG. 10 shows the reduction in power consumption achieved by the present technique in comparison to a previous proposal.

FIG. 10 shows a comparison between the power consumed by a previous proposal (labelled "Osc_load") and the current proposal (labelled "proposed"). In the previous proposal, a ring oscillator was provided to regulate the amount by which the voltage is boosted. This consumes much more power than the current proposal in which a digital feedback method is used to control the pulse density of the clock signal provided to the charge pump 6 using a digital clocked comparator. As shown in FIG. 10, for some cases a power saving of as much as 85% was achieved.

Figure 11:
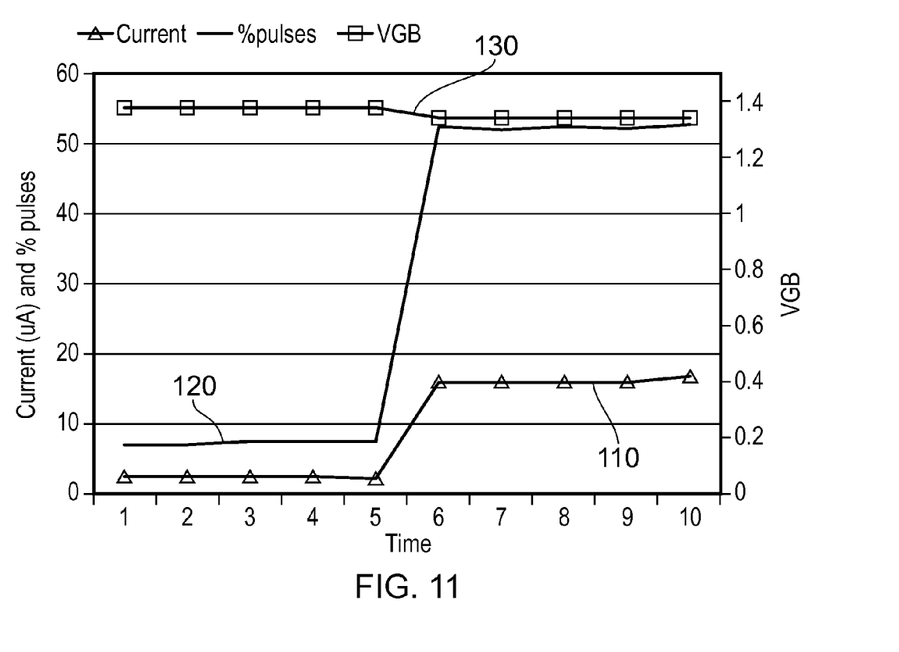
FIG. 11 shows a graph illustrating how the system responds to a change in load of the circuit block.

As well as providing the option of selecting different operating points depending on whether a greater voltage boost or a greater power saving is important, the comparator 50 also allows the system to react to changes in the load of the circuit block 4. An example of this is illustrated in FIG. 11. Line 110 represents the current drawn from the charge pump 6 to feed gate leakage of transistors 16, 18 and leakage in level shifters 24, 26. For an initial period from time 1 to time 5, the current is low indicating that the circuit load is low. As the load is low, the boosted voltage remains higher than if the load is high, and so will take longer to drop from the maximum voltage value to below the sum of the reference voltage and the offset. Therefore, a relatively low number of pulses of the voltage generation clock signal QP per unit time is transmitted as shown in line 120 of FIG. 11. When the circuit load increases at time 6 then this causes the boosted voltage will drop slightly (line 130 of FIG. 11). Hence, the boosted voltage will approach the sum of the reference voltage and the offset more quickly than when the load is low, and so clock pulses will be generated more frequently (see line 120 after time 6). The more frequent clock will cause the voltage to be boosted more regularly to maintain the voltage level required by the increased load. If the load later drops again, then the boosted voltage level will increase again, which will be detected by the comparator and the clock frequency reduced again to save power. Hence, the comparator enables the system to cope with changes in the circuit load to save power by avoiding transmitting too many clock pulses.

Figure 12:
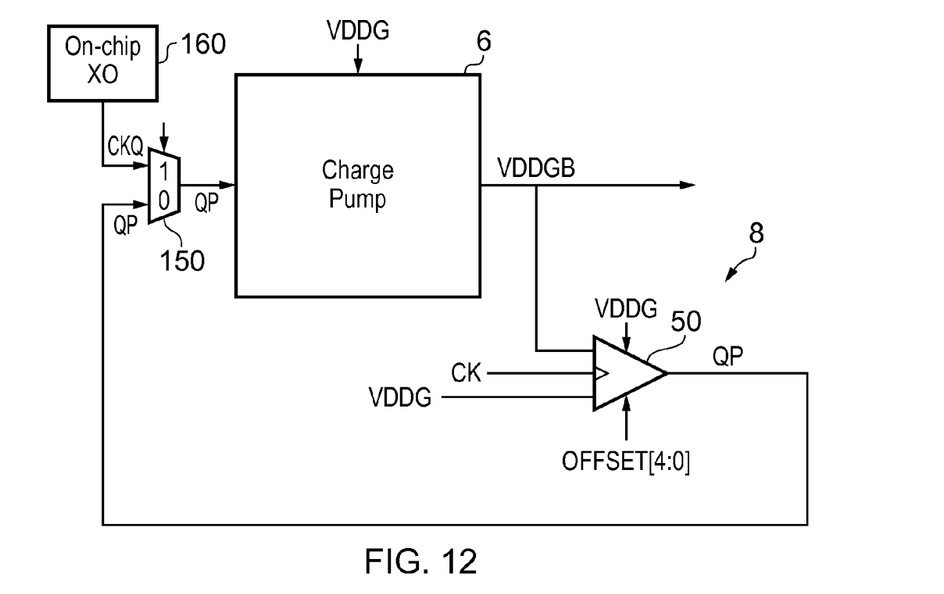
FIG. 12 illustrates an example in which a multiplexer is provided to select one of several clock signals for supplying to the voltage generating circuitry.

FIG. 12 shows another embodiment of the clock control circuitry 8. FIG. 12 is the same as FIG. 5, except that a multiplexer 150 is provided for selecting which clock signal to provide to the charge pump 6. The multiplexer 150 can select between the voltage generation clock signal QP provided from the clock control circuitry 8 and a further clock signal CKQ provided by an on-chip oscillator 160. The further clock signal CKQ can be used if the adaptive power saving provided by the clock control circuitry 8 is not required, or to initialise the charge pump 6 so that it reaches a stable operation before the adaptive technique of the clock control circuitry 8 is activated. In other examples, the multiplexer 150 may be used to select other sources of clock signal, such as selecting between an external clock signal and a clock signal generated on-chip.

Figure 13:
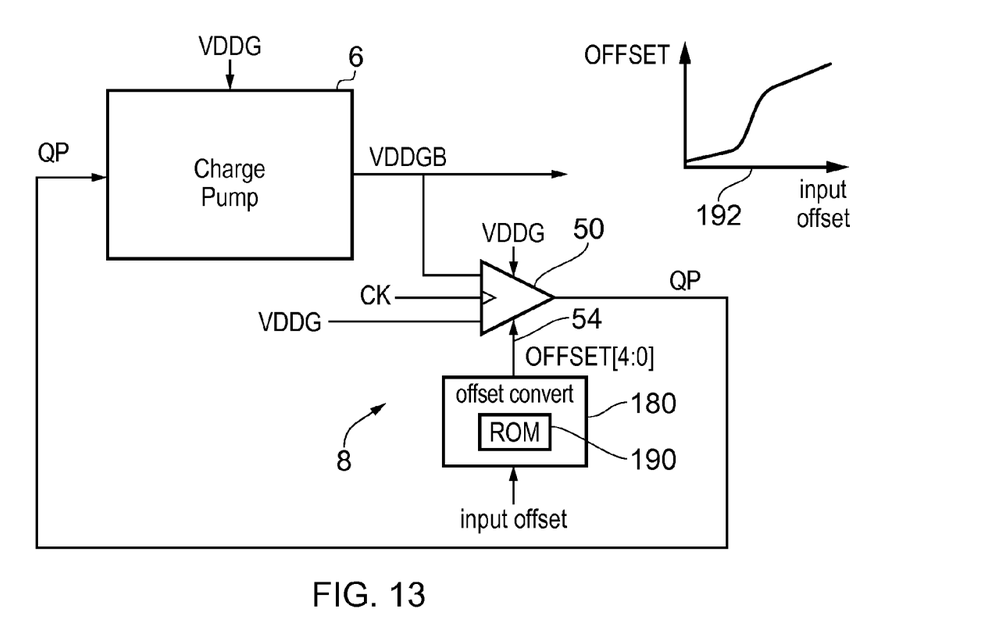
FIG. 13 shows an example in which an offset converter is provided to convert an input offset value into the offset value to be supplied to the clock control circuitry.

FIG. 13 shows another example of the clock control circuitry 8. FIG. 13 is the same as FIG. 5 except that an offset converter 180 is provided to convert an input offset value into a digital offset value 54 to be supplied to the comparator 50. In an ideal implementation, the comparator 50 shown in FIG. 6 may provide a range of evenly distributed offset states providing offsets which vary linearly with different values of the digital offset value 54. In practice however, temperature or process variations may cause a non-linear distribution of the offset points. To give the user the impression that the offsets scale linearly, the offset converter 180 may apply a non-linear mapping of the input offset value to a value to be supplied to the comparator 50. A read only memory 190 may store a mapping between the input offset value and the supplied offset value 54 and convert between the two values. FIG. 13 includes a graph 192 showing an example of how the supplied offset value 54 can vary with the input offset value. It is possible that several values of the input offset value could map to the same digital offset value 54.

While the previous embodiments focus on the use of the clocked comparator 54 for controlling voltage generation by the charge pump 6, it may also be used for other purposes. The comparator 50 may be used in any circuit in which a first voltage is to be compared with a threshold voltage at timings controlled by an input clock, where the threshold voltage needs to be tuned for different comparisons. While previous clocked comparators would have required an analogue voltage generator for generating different reference voltages for comparing against the first voltage, the present technique can use a fixed reference voltage and tune the comparison threshold digitally in response to the offset value 54.

Figure 14:
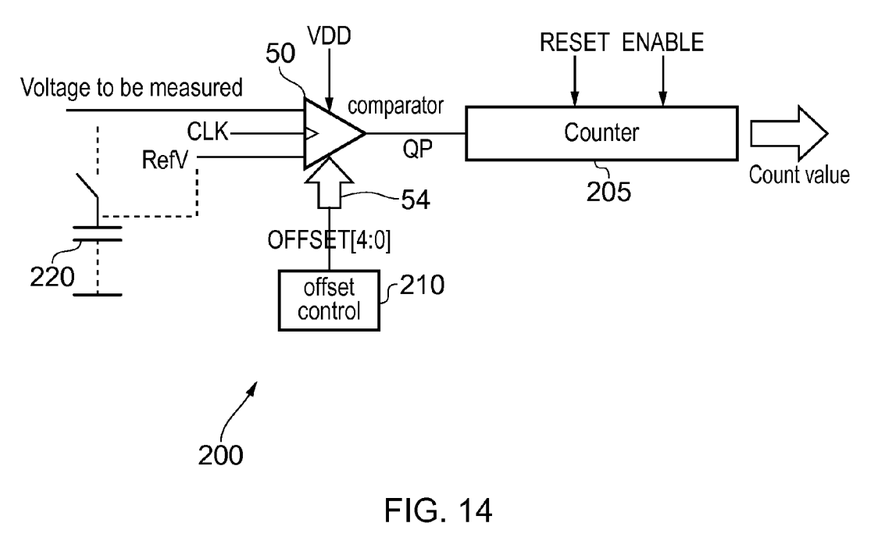
FIG. 14 illustrates an example of using a digitally tunable clocked comparator to measure the magnitude of any arbitrary on-chip voltage.

FIG. 14 shows an example of a voltage measuring device 200 which uses the clocked comparator 50 for measuring the level of an input voltage. The comparator 50 may be the same as in FIG. 6 and generates an output signal QP indicating whether or not, at a rising edge of the input clock signal CLK, the measured voltage is greater or less than the sum of the reference voltage RefV and the offset represented by the offset value 54. With the circuit configuration shown in FIG. 6, if the measured voltage is greater than the sum of the reference voltage and the offset then no clock pulse will be propagated in the output signal QP, and if the measured voltage is less than the sum of the reference and the offset then an output clock pulse will occur. It will be appreciated that the comparator 50 can be modified to generate the clock pulse when the measured voltage is less than the sum of the reference voltage and the offset. The output signal QP therefore gives a qualitative indication of whether the measured voltage is greater or less than the sum of the reference and the offset. By providing different digital offset values, the level to be compared against the measured voltage can be adjusted.

To determine the absolute value of the measured voltage, a counter 205 is provided to count the number of pulses of the output signal QP that occur in a given time period. Reset and enable signals control the resetting and enabling of the counter respectively. After detecting a given number of clock pulses, the offset value 54 is adjusted by offset control circuitry 210 to increment or decrement the offset until the counter 205 detects zero pulses of the output signal QP in the given period of time. The absolute value of the measured voltage is indicated by the offset at the point where the counter counts zero clock pulses for the first time. Each different value for the digital offset value 54 can be mapped to a given voltage difference (for example, the voltage difference for each different offset value 54 may be obtained at test-time and loaded into a memory). The measured voltage can be determined by adding the voltage difference to the reference voltage RefV.

The reference voltage may be any available voltage, whether generated by an on-chip or off-chip generator. If no suitable voltage is available to use as a reference, then, as shown in dotted lines in FIG. 14, the reference voltage may be the value of the measured voltage from a previous processing cycle. A storage element 220 such as a capacitor can be used to store the earlier value of the measured voltage, and this can be compared with the measured voltage using the comparator 50. If the reference voltage RefV is continually updated with successive values of the measured voltage, then the comparator 50 can act as a sigma-delta comparator which detects instantaneous changes in the measured voltage.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A clocked comparator comprising:
a first voltage input configured to receive a first voltage;
a reference voltage input configured to receive a reference voltage;
a clock input configured to receive an input clock signal;
an offset input configured to directly receive a digital offset value comprising a binary numeric value identifying an offset;
comparing circuitry configured to generate an output signal indicating whether, at a clock transition of the input clock signal, the first voltage is greater or less than a sum of the reference voltage and the offset identified by the digital offset value; and
tuning circuitry configured to adjust the comparing circuitry to vary the offset in response to the digital offset value.

2. A clocked comparator comprising:
a first voltage input configured to receive a first voltage;
a reference voltage input configured to receive a reference voltage;
a clock input configured to receive an input clock signal;

an offset input configured to receive a digital offset value comprising a binary numeric value identifying an offset;

comparing circuitry configured to generate an output signal indicating whether, at a clock transition of the input clock signal, the first voltage is greater or less than a sum of the reference voltage and the offset identified by the digital offset value;

wherein the comparing circuitry comprises:

first circuitry configured to cause the output node to be pulled towards a first state in response to the clock transition of the input clock signal, wherein a drive current of the first circuitry is dependent on the first voltage; and second circuitry configured to compete with the first circuitry to cause the output node to be pulled towards a second state in response to the clock transition of the input clock signal, wherein a drive current of the second circuitry is dependent on the reference voltage and the digital offset value; and tuning circuitry configured to adjust the comparing circuitry to vary the offset in response to the digital offset value.

3. The clocked comparator according to claim 2, wherein the second circuitry comprises a plurality of pulling transistors configured to pull the output node towards the second state in response to the clock transition of the input clock signal; and the tuning circuitry is configured to select, in dependence on the digital offset value, how many of the plurality of pulling transistors are active.

4. The clocked comparator according to claim 3, wherein the tuning circuitry comprises at least one switching transistor configured to control whether a corresponding pulling transistor is active in dependence on a corresponding bit of the digital offset value.

5. The clocked comparator according to claim 3, wherein one or more pulling transistors of the plurality of pulling transistors are each configured to have a different drive strength.

6. The clocked comparator of claim 2, wherein the comparing circuitry further comprises a pair of cross coupled inverters that are associated with the output node.

7. The clocked comparator of claim 6, wherein the comparing circuitry further comprises a plurality of reset transistors configured to reset one or more nodes associated with the pair of cross coupled inverters.

8. The clocked comparator of claim 2, further comprising a trigger inverter to enable the competition between the first circuitry and the second circuitry.

9. The clocked comparator of claim 8, wherein the competition between the first circuitry and the second circuitry is enabled in response to the clock transition of the input clock signal.

10. A clocked comparator comprising:
means for receiving a first voltage;
means for receiving a reference voltage;
means for receiving an input clock signal;
means for directly receiving a digital offset value identifying an offset as a binary numeric value;
means for generating an output signal indicating whether, at a clock transition of the input clock signal, the first voltage is greater or less than a sum of the reference voltage and the offset identified by the digital offset value; and
tuning means for adjusting the means for generating to vary the offset in response to the digital offset value.

11. The clocked comparator according to claim 10, wherein the comparing means comprises:
means for outputting the output signal;
means for causing the output node to be pulled towards a first state in response to the clock transition of the input clock signal, wherein a drive current of the means for causing the output node to be pulled towards a first state is dependent on the first voltage; and
means for causing the output node to be pulled towards a second state in response to the clock transition of the input clock signal, wherein a drive current of the means for causing the output node to be pulled towards a second state is dependent on the reference voltage and the digital offset value.

12. The clocked comparator according to claim 11, wherein the means for causing the output node to be pulled towards a second state comprises a plurality of pulling transistors configured to pull the output node towards the second state in response to the clock transition of the input clock signal; and
the tuning means is configured to select, in dependence on the digital offset value, how many of the plurality of pulling transistors are active.

13. The clocked comparator according to claim 12, wherein the tuning means comprises at least one switching transistor configured to control whether a corresponding pulling transistor is active in dependence on a corresponding bit of the digital offset value.

* * * * *